(12) United States Patent
D'Amato et al.

(10) Patent No.: US 6,872,592 B2
(45) Date of Patent: Mar. 29, 2005

(54) METHODS FOR PROVIDING AN INTEGRATED CIRCUIT PACKAGE WITH AN ALIGNMENT MECHANISM

(75) Inventors: Gerald J. D'Amato, Loveland, CO (US); Sari K. Christensen, Fort Collins, CO (US); Nicole Butel, Fort Collins, CO (US)

(73) Assignee: Agilent Technologies, Inc., Palo Alto, CA (US)

( * ) Notice: Subject to any disclaimer, the term of this patent is extended or adjusted under 35 U.S.C. 154(b) by 0 days.

(21) Appl. No.: 10/698,879

(22) Filed: Oct. 30, 2003

(65) Prior Publication Data

US 2004/0089880 A1 May 13, 2004

Related U.S. Application Data

(62) Division of application No. 09/915,076, filed on Jul. 25, 2001, now Pat. No. 6,724,095.

(51) Int. Cl.[7] .............................................. H01L 21/44

(52) U.S. Cl. ........................ 438/106; 438/401; 438/613; 438/108; 438/612

(58) Field of Search ................................. 438/106, 401, 438/612–613, 108

(56) References Cited

U.S. PATENT DOCUMENTS

| 5,191,511 A | 3/1993 | Sawaya |
| 5,558,271 A | 9/1996 | Rostoker et al. |
| 5,642,265 A * | 6/1997 | Bond et al. .................. 361/809 |
| 6,354,844 B1 | 3/2002 | Coico et al. |

* cited by examiner

Primary Examiner—Luan Thai

(57) ABSTRACT

An integrated circuit package is provided with an alignment mechanism by 1) heating a wetting media that has been applied to a number of annular ring shaped alignment pads provided on the integrated circuit package, at known locations with respect to a pattern of contacts pads that is provided on the integrated circuit package, and then 2) while the wetting media is heated, attaching a number of alignment balls or alignment bullets to the annular ring shaped alignment pads.

12 Claims, 3 Drawing Sheets

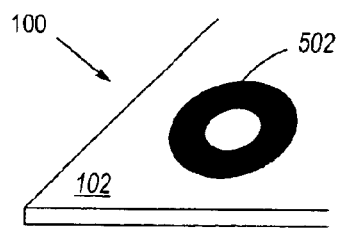 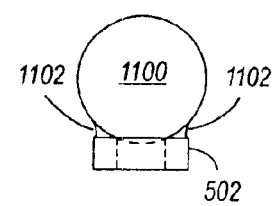
FIG. 10     FIG. 11(a)     FIG. 11(b)
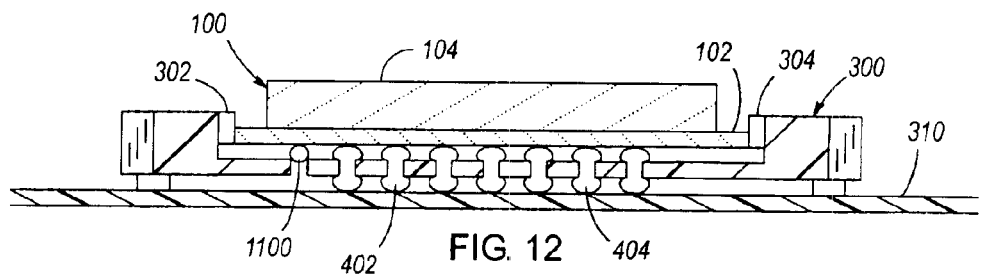
FIG. 12
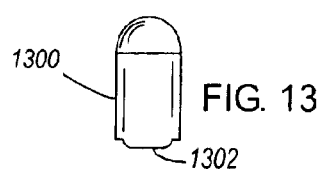 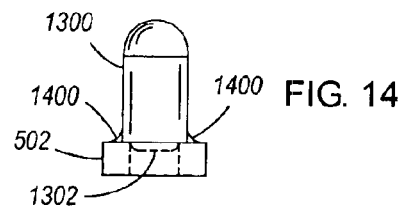
FIG. 13     FIG. 14
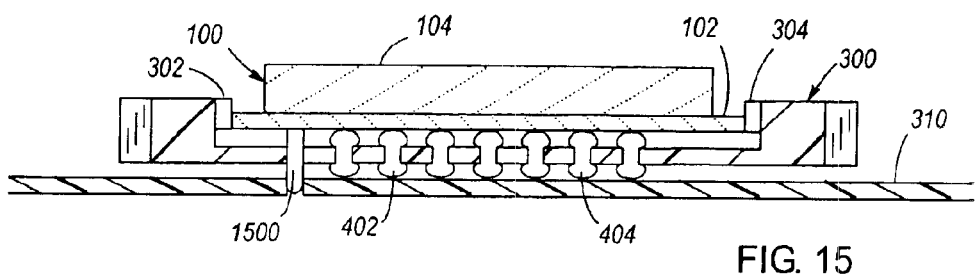
FIG. 15

METHODS FOR PROVIDING AN INTEGRATED CIRCUIT PACKAGE WITH AN ALIGNMENT MECHANISM

CROSS-REFERENCE TO RELATED APPLICATIONS

This is a divisional of application Ser. No. 09/915,076 filed on Jul. 25, 2001, now U.S. Pat. No. 6,724,095, which is hereby incorporated by reference herein.

FIELD OF THE INVENTION

The invention pertains to aligning an integrated circuit package with an interface. More particularly, the invention pertains to methods and apparatus which enable an integrated circuit package to be aligned with an interface when 1) the package's contacts do not provide a sufficient alignment means, and/or 2) the package's edges do not provide a sufficient alignment means (i.e., when the locations of the package's edges with respect to its contacts are not known).

BACKGROUND OF THE INVENTION

There are a number of ways to achieve better performance from an integrated circuit. One way is to reduce the impedance of wire routes, thus enabling circuit signals to propagate more quickly. The impedance of wire routes may be reduced, for example, by minimizing the impedance of wire routes may be reduced, for example, by minimizing the heights of contacts which couple an integrated circuit (IC) to its environment (e.g., by minimizing the heights of contacts provided on an integrated circuit package). The impedance of wire routes may also be reduced by minimizing the lengths of package signal routes. Package signal routes are the means by which contacts on an IC are coupled to contacts on an integrated circuit package. Yet another way to reduce the impedance of wire routes is to provide sufficient separation and/or insulation between package wire routes and/or package contacts.

Integrated circuit packages which reduce the impedance of wire routes by minimizing the heights of contacts and lengths of package signal routes include the ball grid array (BGA) package, the solder column interposer (SCI) package, and the land grid array (LGA) package. An integrated circuit package which reduces the impedance of wire routes by providing better insulation and/or separation between package wire routes and/or package contacts is the ceramic package. Common ceramic packages include the ceramic BGA (CBGA) and the ceramic LGA (CLGA).

Unlike a BGA or SCI package, which is typically soldered to a printed circuit board, an LGA package is typically mounted to a printed circuit board by means of a socket. Since the contacts of an LGA package are more or less flush with the package's bottom surface, an LGA package may be inserted into or removed from its socket with a relatively low insertion force. Thus, LGA packages are well suited for applications in which an integrated circuit is likely to be removed and replaced for purposes of upgrade, troubleshooting, repair, et cetera.

LGA packages such as the CLGA package are advantageous in that they provide greater second level reliability. Also, their strength and rigidity allow them to be inserted into and removed from sockets many times with only a low probability of wear, stress fractures and the like.

One problem with LGA packages (including the subset of CLGA packages) is that they are difficult to align with respect to the environments in which they operate. Often, an LGA package is aligned by means of its edges. For example, the socket illustrated in FIG. 3 uses a number of spring clips to apply pressure to the edges of an LGA package as it is inserted into the socket, thereby ensuring that the contacts of the LGA package are centered over the socket's own contacts.

While many factors contribute to alignment problems, two are particularly notable. First, the edges of an LGA package are not always true, and do not always bear a precise relationship to the LGA package's contact pads. For example, consider an LGA contact pattern which is applied to a ceramic package base. The ceramic package base may be formed by cutting it from a green sheet and then firing it at a high temperature so that it cures. During the firing process, the base is subject to shrinkage which can result in 1) the base becoming out of square, and 2) the base having skewed, curved or wavy edges. Since no two bases shrink in precisely the same way, it is difficult to design a socket such that each and every LGA package will fit into it the same way.

A second problem which contributes to the misalignment of an LGA package within a socket is that the contact pads which are applied to LGA packages are becoming smaller, and are achieving a finer pitch. As a result, the tolerance for error as an LGA package is aligned in a socket is decreasing.

One way in which the above alignment problem has been addressed is by attaching corner solder balls to the surface of an LGA package on which its contact pads are located. An attempt is made to attach the solder balls at fixed locations with respect to the package's contact pads. Holes for receiving the solder balls are then drilled in a socket at fixed locations with respect to the socket's contact pads (i.e., with the holes having the same relationship to the socket's contacts as the solder balls have to the package's contacts). When an LGA package is then inserted into the socket, the socket's spring clips or other alignment means hopefully align the LGA package so that the solder balls at least approximately fit into their corresponding alignment holes in the socket. The curvatures of the alignment balls bearing on the circumferences of the holes then draw the LGA package into its fully aligned position as the LGA package is pressed into the socket.

SUMMARY OF THE INVENTION

New methods and apparatus for aligning an integrated circuit package with an interface (e.g., a socket or printed circuit board) are disclosed herein. The methods and apparatus are particularly applicable to the alignment of an integrated circuit package which does not have self-aligning contacts (e.g., a package that comprises an LGA rather than contact pins). The methods and apparatus also have particular application with integrated circuit packages which lack precise edges as an alignment means (e.g., packages wherein locations of the package's edges with respect to its contacts are not known, as is the case with ceramic packages).

In one embodiment, a pattern of contact pads and number of annular ring shaped alignment pads are applied to a surface of an integrated circuit package, with the number of annular ring shaped alignment pads being applied to the surface at known locations with respect to the pattern of contact pads. The annular ring shaped alignment pads are provided as a means for attaching alignment members such as balls or bullets to the integrated circuit package. The annular ring shape of each alignment pad helps to center an alignment member which is attached to it, thereby providing a more precise relationship between the location of the alignment member and the package's pattern of contact pads.

In another embodiment, a number of alignment bullets are attached to a surface of an integrated circuit package at known locations with respect to a pattern of contact pads. Alignment bullets are advantageous over alignment balls in that they may achieve a greater height without an increase in diameter. Thus, alignment of an integrated circuit package with respect to an interface may be achieved earlier during an installation process. Such an earlier alignment may be advantageous if a socket into which the package is being inserted has contacts which protrude a greater distance from the floor of the socket, and alignment with the contacts is desired before a package's contacts make contact with the socket's contacts. The ability to increase the height of an alignment bullet, without increasing its diameter, may also be advantageous when the alignment bullet is used to align an integrated circuit package with more than one interface (e.g., to align a package with a socket, and then align the combined package and socket with a printed circuit board).

To achieve adequate alignment between an integrated circuit package's pattern of contact pads and alignment pads, it is preferred that the contact pads and alignment pads be applied to the integrated circuit package at the same time. For example, alignment pads and contact pads may be screened onto an LGA package in a single operation.

In another embodiment, a number of alignment members are attached to an integrated circuit package after heating a wetting media (e.g., a paste solder) which is applied to a number of annular ring shaped alignment pads provided on the integrated circuit package. The number of annular ring shaped alignment pads are provided at known locations with respect to a pattern of contact pads which is also provided on the integrated circuit package. Use of the wetting media is advantageous in that 1) surface tension of the heated wetting media helps to center the alignment members over the alignment pads as 2) the wetting action of the wetting media seats the alignment members on the alignment pads. Precise alignment between the alignment members and the pattern of contact pads may therefore be maintained.

In yet another embodiment, a number of alignment bullets are attached to an integrated circuit package after heating a wetting media which is applied to a number of alignment pads provided on the integrated circuit package. The number of alignment pads are provided at known locations with respect to a pattern of contact pads which is also provided on the integrated circuit package. As in the previous embodiment, use of the wetting media is advantageous in that 1) surface tension of the heated wetting media helps to center the alignment bullets on the alignment pads as 2) the wetting action of the wetting media helps to seat the alignment members on the alignment pads. Precise alignment between the alignment bullets and the pattern of contact pads may therefore be maintained.

BRIEF DESCRIPTION OF THE DRAWINGS

Illustrative and presently preferred embodiments of the invention are illustrated in the drawings, in which:

FIG. 10 is a perspective view of an annular ring shaped alignment pad which may form part of the FIG. 5 alignment mechanism;

FIGS. 11(a) & 11(b) are elevational views of a third embodiment of the FIG. 5 alignment mechanism;

FIG. 12 is a cross-sectional view showing how the FIG. 11 alignment mechanism may be used to align the FIG. 5 integrated circuit package within a socket;

FIG. 13 is an elvational view of an alignment bullet which may form part of the FIG. 5 alignment mechanism;

FIG. 14 is an elevational view showing the FIG. 13 alignment bullet attached to the FIG. 10 alignment pad; and FIG. 15 is a cross-sectional view showing how an elongated version of the FIG. 8 alignment bullet may be used to align the FIG. 4 integrated circuit package within a socket.

DESCRIPTION OF THE PREFERRED EMBODIMENT

Figure 1:
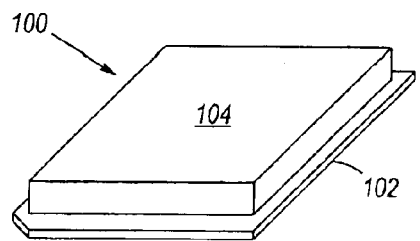
FIG. 1 is a top perspective view of an integrated circuit package.
Figure 2:
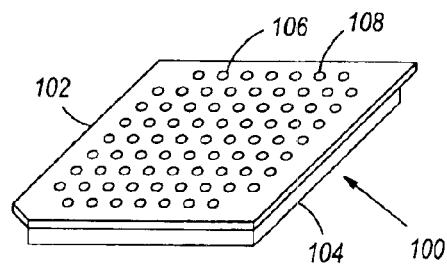
FIG. 2 is a bottom perspective view of the FIG. 1 integrated circuit package.

An integrated circuit package 100 is generally illustrated in FIGS. 1 & 2. By way of example, the package 100 is shown to be a ceramic land grid array (CLGA) package (although the alignment methods and apparatus disclosed herein may be used in conjunction with a variety of integrated circuit packages, such as other LGA packages, BGA packages, et cetera). The CLGA package 100 comprises a ceramic base 102 and a lid 104. An integrated circuit is mounted to the top surface of the ceramic base 102, beneath the lid 104. The integrated circuit is then connected to contacts which terminate in a contact pad pattern which is applied to (e.g., screened) onto the bottom surface of the ceramic base 102 (FIG. 2). Each contact pad 106, 108 may be formed of gold, or any other conductive material which will provide sufficient electrical contact between the integrated circuit and an adjacent electrical/mechanical interface to which it is connected.

Figure 3:
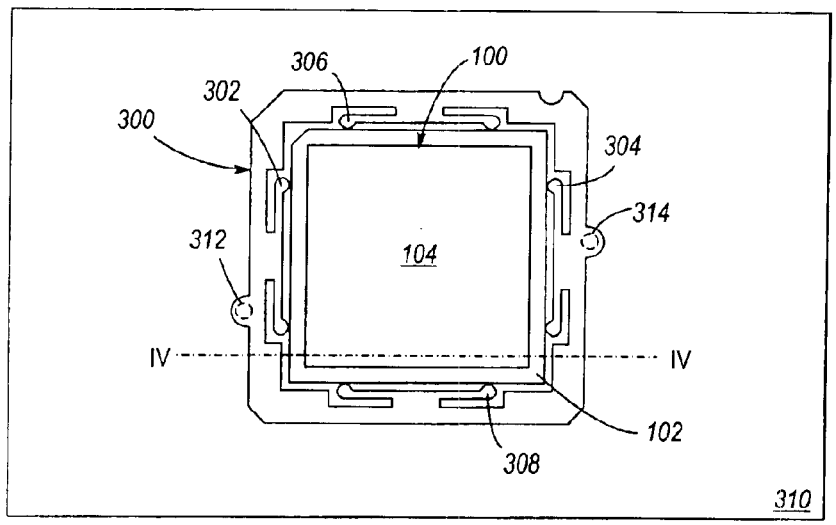
FIG. 3 is a plan view of the FIG. 1 integrated circuit package, wherein the package has been mounted to a printed circuit board via a socket.
Figure 4:
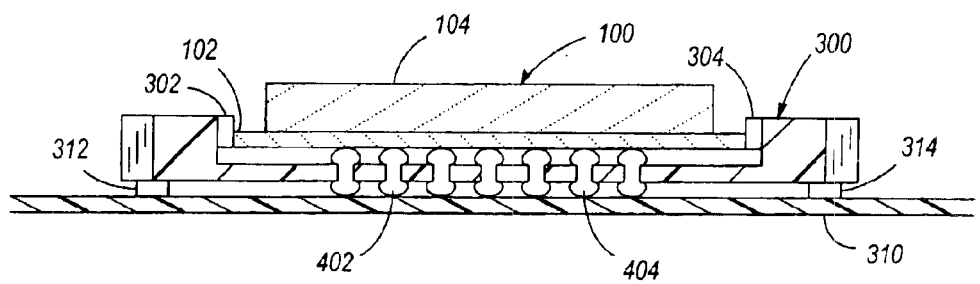
FIG. 4 is an enlarged cross-sectional view of the apparatus illustrated in FIG. 3.

In FIGS. 3 & 4, the CLGA package 100 of FIGS. 1 & 2 is shown mounted in an elastomer button socket 300. A socket 300 which is similar to that shown in FIGS. 3 & 4 is available from Thomas & Betts Corporation of Memphis, Tenn. The socket 300 comprises a plurality of elastomer buttons 402, 404 (FIG. 4), each of which makes contact with a corresponding contact pad 106, 108 of the CLGA package 100. Each button 402, 404 is impregnated with a conductive material such as silver. The socket 300 is designed to align the package's contact pads 106, 108 with respect to the socket's elastomer buttons 402, 404 by using a plurality of spring clips 302, 304, 306, 308 to apply equal pressure to each edge of the package's base 102. If a package's edges are true, and if the edges of each package 100 which may be inserted into the socket 300 bear a precise relationship with respect to the package's pattern of contact pads 106, 108, then the spring clips 302–308 should adequately align the package's contact pads 106,108 over the socket's elastomer buttons 402, 404 as the package 100 as inserted into the socket 300.

The socket 300 may be mounted to a printed circuit board 310 via suitable mounting pins 312, 314 or other means.

When the socket 300 is mounted to a printed circuit board 310, the same elastomer buttons 402, 404 which make contact with the contact pads 106, 108 of a package 100 make contact with corresponding contact pads on the printed circuit board 310. Signal flow between an integrated circuit mounted within the package 100, and an interface external to the package 100 (e.g., one coupled to the printed circuit board 310), is therefore possible.

Although sockets such as that which is illustrated in FIGS. 3 & 4 provide an advantageous means for mounting CLGA packages 100 to printed circuit boards 310, problems pertaining to alignment of a CLGA package 100 within such a socket 300 still persist. While many factors contribute to alignment problems, two are particularly notable. First, the edges of a CLGA package 100 are not always true (sometimes merely because of allowed manufacturing tolerances), and the edges of a CLGA package 100 do not always bear a precise relationship to a CLGA package's contact pads 106, 108. This is because the ceramic base 102 of a CLGA package 100 is typically formed by cutting it from a green sheet and then firing it at a high temperature so that it cures. During the firing process, the base 102 is subject to shrinkage which can result in 1) the base 102 becoming out of square, and 2) the base 102 having skewed, curved or wavy edges. Since no two bases are likely to shrink in precisely the same way, it is difficult to design a socket 300 such that each and every CLGA package 100 will fit into it the same way.

Figure 6:
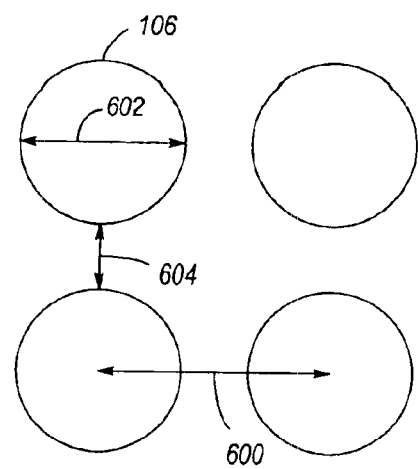
FIG. 6 is an enlarged plan view of four of the contact pads illustrated in FIG. 5.

A second problem which contributes to the misalignment of a CLGA package 100 within a socket 300 is that the contact pads 106, 108 which are applied to a CLGA package 100 are migrating towards smaller sizes and finer pitches. See, for example, the exemplary contact pad spacings illustrated in FIG. 6, wherein the center-to-center spacing 600 of contact pads is 1000 microns ($\mu$m), the diameter 602 of each contact pad 106 is 700 $\mu$m, and the spacing 604 between each contact pad is only 300 $\mu$m. If a button 402 of an elastomer button socket 300 is designed to contact as large a portion of a package's contact pad 106 as possible (e.g., to ensure good electrical contact), then a mere 300 $\mu$m shift in the alignment of a package 100 will result in a short between two of a package's contact pads. Typically, an alignment error of 100 $\mu$m, ±50–75 $\mu$m, is the maximum alignment error tolerated in an environment such as that illustrated in FIG. 3. As a result, the tolerance for error as a package 100 is aligned with its environment (e.g., a socket 300) is decreasing. Given that there is a limit to how precisely a package's edges may be formed, and given the constant push to decrease the dimensions 600–604 shown in FIG. 6, the adequacy of the alignment means illustrated in FIG. 3 (i.e., the socket's spring clips 302–308) is quickly being surpassed.

Figure 5:
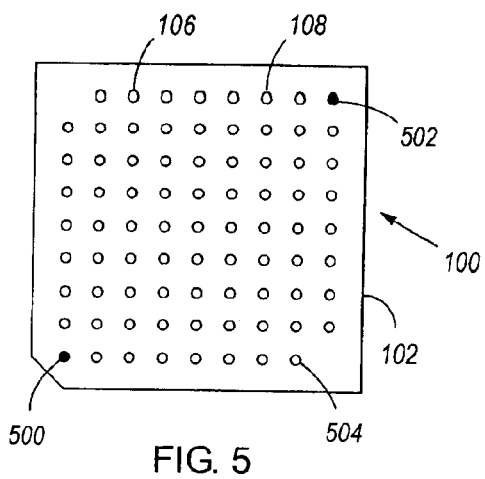
FIG. 5 is a plan view of an integrated circuit package comprising an alignment mechanism.

Currently, the pitch of contact pads 106, 108 on a CLGA package 100 is such that the spring clips 302–308 of the FIG. 3 socket 300 provide a means for grossly aligning a package's contact pads 106, 108 over a socket's elastomer buttons 402, 404. A mechanism for fine-tuning a package's alignment is therefore needed. Such an alignment mechanism is illustrated in FIG. 5. The alignment mechanism comprises a number of alignment pads 500, 502, 504 (at least two, and preferably three) which are applied to a package 100 at known locations (e.g., at corners) with respect to the package's pattern of contact pads 106, 108. Preferably, the alignment pads 500, 502, 504 are applied to the same surface as the pattern of contact pads 106,108. The alignment pads 500, 502, 504 are also preferably applied to the package 100 at the same time that the pattern of contact pads 106, 108 is applied to the package 100. In this manner, their locations with respect to the package's contact pads 106, 108 can be more precisely controlled. For example, the alignment pads 500, 502, 504 may be applied at the same time that the contact pads 106, 108 are applied, by means of a silk screening, stenciling, or plating operation.

Each of the FIG. 5 alignment pads 500, 502, 504 may be used as a means for attaching (e.g., soldering) an alignment member to an integrated circuit package, as illustrated in FIGS. 7, 8, 11 & 14. A more detailed discussion of the means by which an alignment member may be attached to an alignment pad is found below. However, this discussion is preceded by a discussion of the types of alignment members which may be attached to an alignment pad.

Figure 7:
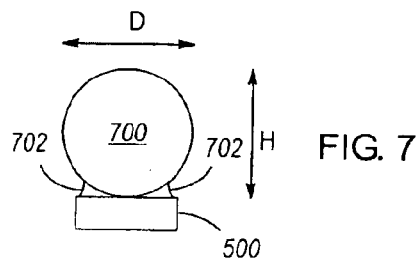
FIG. 7 is an elevational view of a first embodiment of the FIG. 5 alignment mechanism.

In FIG. 7, an alignment ball 700 is attached to an alignment pad 500. The height of the ball 700 is preferably greater than the distance by which the elastomer buttons 402, 404 protrude above the floor of the socket 300. In this manner, the alignment ball 700 will protrude through a corresponding hole in a socket 300 prior to when a package's contact pads 106, 108 make contact with the socket's elastomer buttons 402, 404. If the height of the ball 700 is less than the distance by which the elastomer buttons 402, 404 protrude above the surface of the socket 300, then a package's contact pads 106, 108 will make contact with the socket's elastomer buttons 402, 404 prior to precise alignment of the package 100 in the socket 300. If this happens, then compression and flexion of the socket's elastomer buttons 402, 404 may not allow them to properly realign themselves with the package's contact pads 106, 108. Preferably, the height of the alignment ball 700 is such that half or more of the ball 700 protrudes through the socket 300 prior to the package's contact pads 106, 108 making contact with the socket's elastomer buttons 402, 404. In this manner, a package 100 will be "fully aligned" prior to the package's contact pads 106, 108 making contact with the socket's elastomer buttons 402, 404. For purposes of the socket 300 illustrated in FIGS. 3 & 4, the diameter D of an alignment ball may be, for example, 889$\mu$m. The diameter of an alignment pad 500 is preferably smaller than the diameter of an alignment ball 700 which is attached to it. In this manner, the alignment pad 500 (in combination with a wetting media) can aid in centering the alignment ball 700.

While in the case of a CLGA package 100, it is preferable that half or more of an alignment ball 700 protrude through a socket 300 prior to the package's contact pads 106, 108 making contact with the socket's elastomer buttons 402, 404, such may not be the case with a BGA package and printed circuit board 310. If an alignment ball 700 is mounted to a BGA package, it is preferable that less than half of the alignment ball 700 protrude through the printed circuit board 310. Since the balls of a BGA package are typically formed of solder, and therefore collapse when they are heated, it is difficult to maintain the standoff height of a BGA package from a printed circuit board 310. If an alignment hole has a diameter which is smaller than that of an alignment ball 700, and the alignment ball 700 is sufficiently hard (i.e., not formed from solder or a soft metal), then the alignment ball 700 will seat on the alignment hole and tend to lessen the collapse of a BGA package's solder balls. Preferably, three or more alignment balls 700 are provided at corners of a BGA package for this purpose. Increased standoff height of a BGA package helps to improve second level reliability and the ability to clean during the assembly process.

Figure 8:
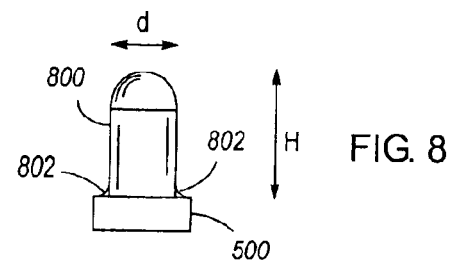
FIG. 8 is an elevational view of a second embodiment of the FIG. 5 alignment mechanism.

Since an alignment ball 700 has a diameter D which is equal to its height H, the distance by which it can protrude through a socket 300 is limited by the surface area of an integrated circuit package 100 which is provided for it. If greater protrusion through a socket 300 is needed for alignment purposes, an alignment bullet 800 as illustrated in FIG. 8 may be attached to an alignment pad 500. The alignment bullet 800 is advantageous in that a greater bullet height H may be achieved with a smaller bullet diameter "d". As will be understood by those of ordinary skill in the art, the shape of a bullet 800 may vary depending on the particular application in which it is used. Thus, the shape of the alignment bullet 800 portrayed in FIG. 8 is merely exemplary.

Figure 9A:
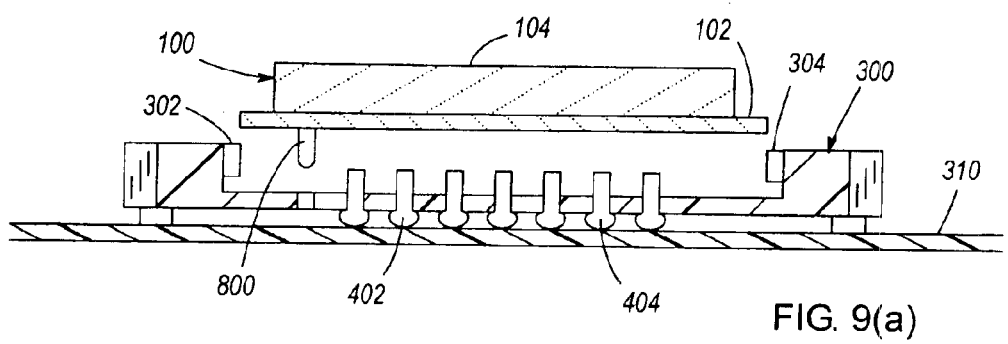
FIGS. 9(a) & 9(b) are cross-sectional views showing how the FIG. 8 alignment mechanism may be used to align the FIG. 4 integrated circuit package within a socket.
Figure 9B:
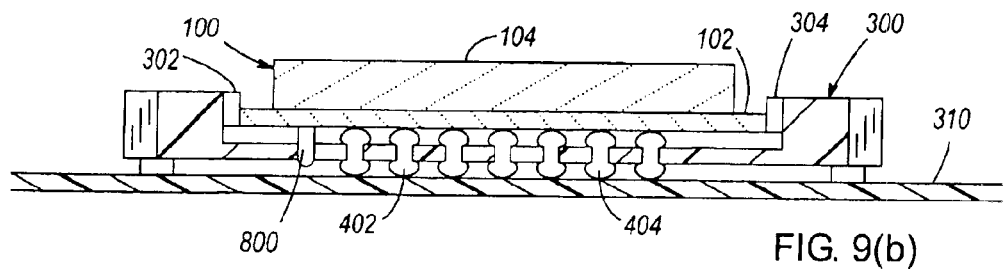

FIGS. 9(a) & 9(b) illustrate the insertion of an integrated circuit package 100 into a socket 300. Note that in comparison to FIG. 4, the package 100 illustrated in FIGS. 9(a) & 9(b) has an alignment bullet 800 mounted thereto, and the socket 300 into which the package 100 is inserted has a hole drilled therein for accepting the alignment bullet 800. FIG. 9(a) shows the integrated circuit package 100 in a position wherein the spring clips 302–308 of the socket 300 have grossly aligned the package 100 with respect to the socket's elastomer button contacts 402, 404, but wherein the package's alignment bullet 800 has yet to seat in its corresponding hole in the socket 300. FIG. 9(b) shows the integrated circuit package 100 in a position wherein the package's alignment bullet 800 has fully seated in its corresponding hole in the socket 300. As the package 100 is moved from its positions in FIG. 9(a) to its position in FIG. 9(b), note that the height of the alignment bullet 800 allows it to seat in its corresponding socket hole prior to when the package's contact pads 106, 108 make contact with the socket's elastomer button contacts 402, 404. As a result, compression of the socket's elastomer button contacts 402, 404 does not begin until the package 100 is precisely aligned. However, in some cases, the height of the alignment bullet 800 may be less than the distance by which the elastomer button contacts 402, 404 extend from the floor of the socket 300. For example, if the elastomer button contacts 402, 404 are strong enough to realign under some amount of compression (or if the socket's contacts are of some other form which enables them to realign under compression—e.g., spring biased contacts), then the height H of the bullet 800 may be less than the distance by which the elastomer button contacts 402, 404 extend from the floor of the socket 300.

Although alignment balls have been made of solder in the past, a problem with solder balls is that they are subject to deformation. Often solder balls are deformed during test and/or shipping of an integrated circuit. As a result, they do not adequately serve to align an integrated circuit package 100 when the package 100 is inserted into its end-use environment. Furthermore, if the solder ball itself provides the means by which the ball is attached to an alignment pad 500, heating of the solder ball tends to cause its collapse so that after attachment, the solder ball largely takes the form of a solder lump. The final height and diameter of the solder lump may therefore only be "approximately" known. The alignment members 700, 800 illustrated in FIGS. 7 & 8 are therefore preferably formed of a hard material such as nickel-plated steel or copper, and are hard enough to resist deformation as a package 100 is aligned with an interface 300.

The alignment members 700, 800 illustrated in FIGS. 7 & 8 are attached to an alignment pad 500 using a wetting media 702, 802. The wetting media 802 may be, for example, a paste solder (i.e., a flux impregnated solder). The wetting media 802 may be deposited on the alignment pad 500 and then heated to a liquid state. When heated, surface tension of the liquified wetting media 802 causes an alignment member 700, 800 placed in contact therewith to float. If the alignment pad 500 is of a sufficiently small size (and preferably smaller in diameter than the alignment member 700, 800), then the surface tension of the wetting media 802 not only causes the alignment member 700, 800 to float, but also causes the alignment member 700, 800 to center over the alignment pad 500. Assuming that the alignment member 700, 800 is solderable, the wetting action of the wetting media 802 then pulls the alignment member 700, 800 down into a seated and centered position on the alignment pad 500. As the wetting media 802 is cooled, the wetting media 802 bonds the centered alignment member 700, 800 to the alignment pad 500. In this manner, precise alignment between the alignment members 700, 800 and the pattern of contact pads 106, 108 may therefore be maintained.

Using methods similar to those which are used to apply contact and alignment pads 106, 108, 500, 502 to a package 100, a wetting media 802 may be deposited on the alignment pads 500, 502 of a package 100 by means of a silk screening or stenciling operation. A wetting media 802 may also be deposited by means of automatic dispensing equipment (e.g., a computer controlled syringe).

When a wetting media 802 is applied to the entirety of an alignment pad 500, the pad's diameter is preferably 1) smaller than that of the alignment member 800, and 2) only large enough to provide a good bonding surface for the alignment member 800. In this manner, the surface area of the wetting media 802 will provide a smaller area over which the alignment member 800 may float, and the alignment member 800 may be more precisely centered over an alignment pad 500 prior to when the wetting action of the wetting media 802 pulls the alignment member 800 into a seated position on the alignment pad.

To further aid in centering an alignment member 800 on an alignment pad 502, the alignment pad 502 may be shaped as an annular ring (FIG. 10). The outside diameter of the pad 502 may be, for example, 600 $\mu$m, and the height of the pad 502 may be, for example, 12 $\mu$m.

In FIG. 11(a), an annular ring shaped alignment pad 502 is shown with a wetting media 1102 deposited thereon. An alignment ball 1100 is suspended above the alignment pad 502, but is not yet attached thereto. After the wetting media 1102 is heated and the alignment ball 1100 is placed in contact with same, the surface tension and wetting action of the wetting media 1102, in combination with the annular ring shape of the alignment pad 502, cause the alignment ball 1100 to center on the alignment pad 502. Assuming that the alignment ball 1100 and alignment pad 502 are solderable, and that the wetting media 1102 comprises solder, then the alignment ball 1100 will bond to the alignment pad 502 as the wetting media 1102 cools, as shown in FIG. 11(b). An integrated circuit package 100 with attached alignment ball 1100 is shown aligned and seated within an elastomer button socket 300 in FIG. 12.

So that an alignment bullet 1300 may easily be centered on an annular ring shaped alignment pad 502, the alignment bullet 1300 may be provided with a raised disc 1302 on one end (FIG. 13). If the diameter of the raised disc 1302 is less than the inside diameter of the annular ring shaped alignment pad 502, then the raised disc 1302 may protrude into the hole in the alignment pad 502 when the alignment bullet 1300 is placed on the alignment pad 502 (FIG. 14). The closer the diameter of the raised disc 1302 is to the inside diameter of the annular ring 502, the more precisely the alignment bullet 1300 will be centered on the alignment pad 502. Furthermore, substantial equality in the diameters of the raised disc 1302 and the inner portion of the annular ring 502 helps to suppress bending moments as the alignment bullet 1300 seats itself in an interface 300. In the case of an alignment bullet 1300, precise centering is best achieved with the aid of a heated wetting media 1400, and with a raised disc 1302 having rounded edges.

An integrated circuit package 100 with an alignment mechanism as shown in FIG. 14 will align and seat within a socket 300 as illustrated in FIGS. 9(a) & 9(b).

It has been mentioned that an alignment bullet 1300 may achieve greater heights without an increase diameter. In FIG. 15, there is shown an alignment bullet 1500 which is long enough to align an integrated circuit package 100 with two interfaces (i.e., a socket 300 and a printed circuit board 310).

While the above description has focused, by way of example, on the alignment of integrated circuit packages 100 within an elastomer button socket 300, the above methods and apparatus may be used to align various types of integrated circuit packages with various types of interfaces. As already mentioned, another type of integrated circuit package which can benefit from the disclosed methods and apparatus is the ball grid array package. Other types of interfaces with which a package 100 may need to be aligned include printed circuit boards 310, test sockets, and other interfaces.

While illustrative and presently preferred embodiments of the invention have been described in detail herein, it is to be understood that the inventive concepts may be otherwise variously embodied and employed, and that the appended claims are intended to be construed to include such variations, except as limited by the prior art.

What is claimed is:

1. A method for providing an integrated circuit package with an alignment mechanism, comprising:
   a) applying a pattern of contact pads to the integrated circuit package;
   b) applying a number of annular ring shaped alignment pads to said integrated circuit package, at known locations with respect to said pattern of contact pads; and
   c) attaching a number of alignment balls to said number of annular ring shaped alignment pads.

2. The method of claim 1, further comprising:
   a) applying a wetting media to said number of annular ring shaped alignment pads; and
   b) heating said wetting media; and
   c) attaching said number of alignment balls to said number of annular ring shaped alignment pads while said wetting media is heated.

3. The method of claim 1, further comprising applying said pattern of contact pads and number of annular ring shaped alignment pads to the integrated circuit package at the same time.

4. The method of claim 1, further comprising choosing said alignment balls to have diameters that are greater than the diameters of their corresponding alignment pads.

5. The method of claim 1, wherein the number of alignment balls attached is three.

6. A method for providing an integrated circuit package with an alignment mechanism, comprising:
   a) heating a wetting media that has been applied to a number of annular ring shaped alignment pads provided on said integrated circuit package at known locations with respect to a pattern of contacts pads provided on said integrated circuit package; and
   b) attaching a number of alignment balls to said number of annular ring shaped alignment pads while said wetting media is heated.

7. The method of claim 6, further comprising choosing said alignment balls to have diameters that are greater than the diameters of their corresponding alignment pads.

8. The method of claim 6, wherein the number of alignment balls attached is three.

9. A method for providing an integrated circuit package with an alignment mechanism, comprising:
   a) heating a wetting media that has been applied to a number of annular ring shaped alignment pads provided on said integrated circuit package at known locations with respect to a pattern of contacts pads provided on said integrated circuit package; and
   b) attaching a number of alignment bullets to said number of annular ring shaped alignment pads while said wetting media is heated.

10. The method of claim 9, wherein at least one of said alignment bullets has an end which is shaped to protrude into one of said number of annular ring shaped alignment pads, and wherein the method further comprises placing said end of said alignment bullet in contact with the wetting media which is applied to one of said alignment pads.

11. The method of claim 10, wherein one of said alignment bullet ends that protrudes into an annular ring shaped alignment pad comprises a raised disc.

12. The method of claim 9, wherein the number of alignment bullets attached is three.

* * * * *